United States Patent
Nicolai et al.

(10) Patent No.: US 6,375,561 B1
(45) Date of Patent: Apr. 23, 2002

(54) SWITCH CUPBOARD WITH DEVICES FOR COOLING THE HOT AIR INSIDE

(75) Inventors: Walter Nicolai, Buseck; Adam Pawlowski, Eschenburg, both of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/530,332

(22) PCT Filed: Jan. 19, 1999

(86) PCT No.: PCT/EP99/00311

§ 371 Date: Apr. 28, 2000

§ 102(e) Date: Apr. 28, 2000

(87) PCT Pub. No.: WO99/40767

PCT Pub. Date: Aug. 12, 1999

(30) Foreign Application Priority Data

Feb. 7, 1998 (DE) .......................................... 198 04 904

(51) Int. Cl.⁷ .................................................. H05K 5/00
(52) U.S. Cl. ........................................ 454/184; 361/690
(58) Field of Search .......................... 454/184; 361/695, 361/690

(56) References Cited

U.S. PATENT DOCUMENTS

| | | | | |
|---|---|---|---|---|
| 3,120,166 A | * | 2/1964 | Lyman | 454/184 |
| 3,559,728 A | * | 2/1971 | Lyman | 165/55 |
| 3,626,251 A | * | 12/1971 | Vigue | 317/100 |
| 4,163,144 A | * | 7/1979 | Reynier | 219/368 |
| 5,422,787 A | * | 6/1995 | Gourdine | 361/697 |
| 5,467,250 A | * | 11/1995 | Howard et al. | 361/696 |
| 5,559,673 A | * | 9/1996 | Gagnon et al. | 361/695 |
| 5,875,965 A | * | 3/1999 | Lee | 236/446 |

* cited by examiner

Primary Examiner—Harold Joyce
Assistant Examiner—Derek S. Boles
(74) Attorney, Agent, or Firm—Pauley Petersen Kinne & Erickson

(57) ABSTRACT

A switch cupboard with devices for cooling the hot air present inside the same. At least one vertical face is closed off by a double-walled wall element whose outer and inner wall panel form an air duct with an extensive surface. The inner wall panel has several openings spread out from each other. The openings can be covered either with cover plates, fans which operate in two directions of rotation or connecting plates with sections of hose.

17 Claims, 1 Drawing Sheet

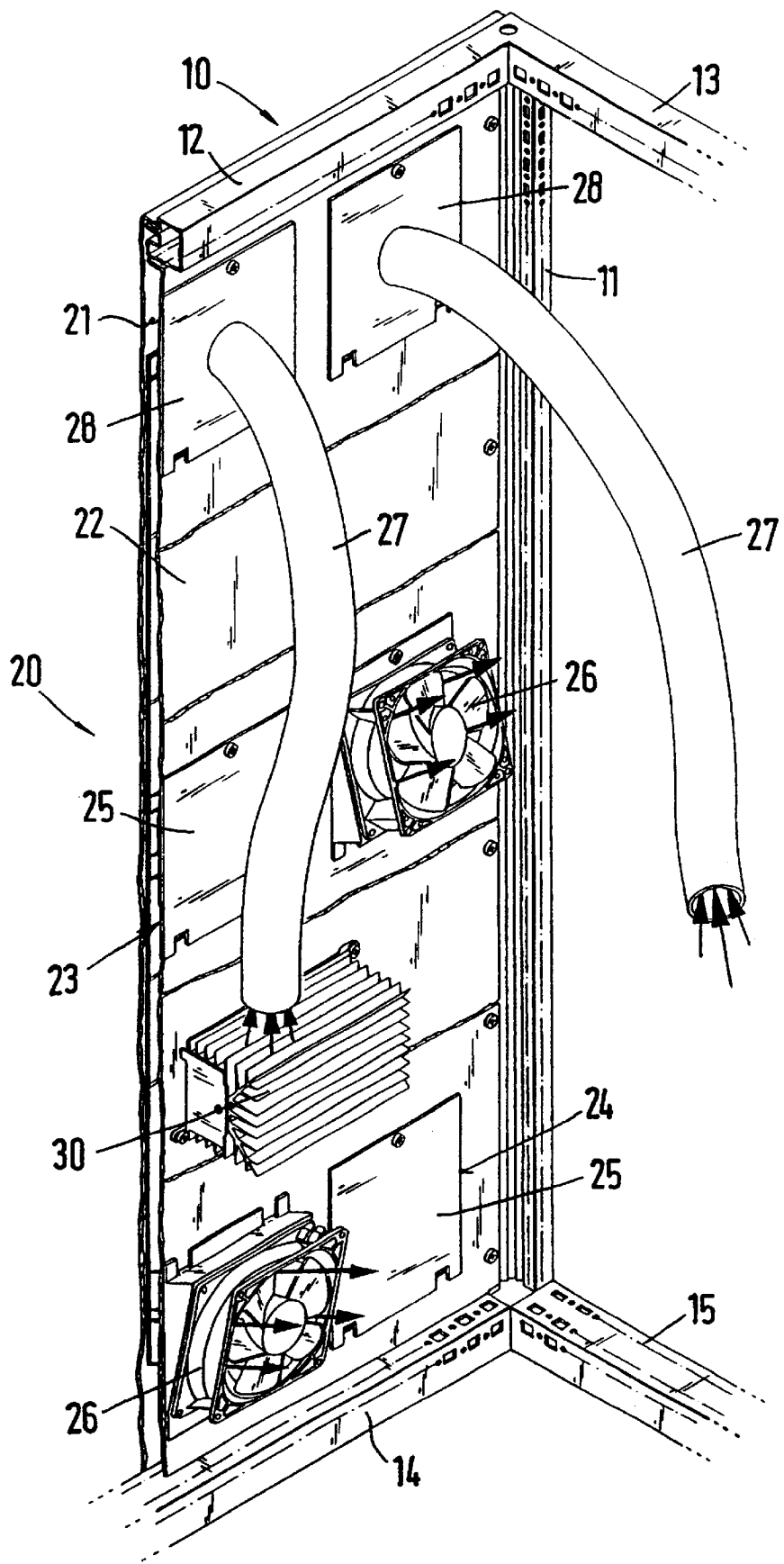

SWITCH CUPBOARD WITH DEVICES FOR COOLING THE HOT AIR INSIDE

BACKGROUND OF THE INVENTION

1. Field of the Invention

This invention relates to a switchgear cabinet with devices for cooling the heated air generated in the devices.

2. Description of Prior Art

Cooling devices, which can be installed on the top of the switchgear cabinet are known, which draw the heated air from the interior of the switchgear cabinet and return it to the interior of the switchgear cabinet, after it has been cooled.

Heat exchangers designed as wall elements are known, which have the same function.

These known devices have one disadvantage; they cannot be adapted to various conditions in the interior of the switchgear cabinet. For example, there is the repeated desire to draw the air in a specific manner from clearly defined locations in the interior, or to directly conduct the returned cooled air to components mounted at arbitrary locations of the interior.

SUMMARY OF THE INVENTION

It is one object of this invention to provide a switchgear cabinet with devices for cooling the heated air generated in the interior so that the air circulation in the interior can easily be adapted to various conditions.

In accordance with this invention, this object is achieved with at least one vertical side closed off with a double-walled wall element, whose outer and inner wall sections form an air conduit with a large surface. Several openings are cut, distributed over the inner wall section, which can selectively be covered by cover plates, or fans, which can be operated in both directions of rotation, and hose sections with connector plates.

Depending on the covering of the openings, it is possible with the fans to draw off or blow in air at all these locations having openings. The same applies for the hose sections, which in this case can be brought to specific components, which are arbitrarily distributed over the interior. Openings which are not used can be covered with the cover plates. Equipping the inner wall section as a part of the heat exchanger can be varied in many ways and optimally adapted to the conditions prevailing in the interior.

In accordance with a preferred embodiment, the openings are distributed in a grid pattern in the inner wall section. Thus it is possible to assemble the inner wall section from several vertically divided wall panels.

In one advantageous embodiment the openings have a square cross section.

If fans are used, whose input and output connecting planes are at an acute angle with respect to each other, the fans can be attached in any arbitrarily rotated position to the square openings. Thus the directions in which the air flow is drawn off or blown in can be oriented in different directions. The fans can preferably be operated as suction blowers and pressure blowers.

If the hose sections are designed to be resilient, open ends of the hose sections can easily be guided to the components arranged at arbitrary locations in the interior of the switchgear cabinet. It is possible to charge the components with cooled air in a specific manner. It is also possible to draw off the heated air emitted by the components in a specific manner.

The double-walled wall element is embodied as a heat exchanger, wherein the air conduit with a large surface provides a steep temperature gradient when filled with warm air. Good efficiency is achieved with this because of the heat exchanger.

The double-walled wall element can close off a lateral wall or the rear wall of the switchgear cabinet. However, it can also be designed to be the switchgear cabinet door.

BRIEF DESCRIPTION OF THE DRAWING

This invention will be explained in greater detail by means of an exemplary embodiment, shown in a perspective partial view in the drawing.

DETAILED DESCRIPTION OF PREFERRED EMBODIMENTS

The switchgear cabinet of one embodiment has a rack 10, with vertical and horizontal frame legs 11, 12, 13, 14 and 15, whose sides are or can be closed off by means of wall elements and at least one switchgear cabinet door. As the partial view shows, a vertical side, for example, of the rack 10 is closed off by means of a double-walled wall element 20, which comprises an outer wall section 21 and an inner wall section 22. Both wall sections 21 and 22 form a heat exchanger with a large surface with an air conduit 23 of a correspondingly large surface between the wall sections 21 and 22.

The inner wall section 22 can also be divided into several wall panels in the vertical direction.

Openings 25 are cut in a grid shape, distributed over the entire surface of the inner wall section 21, which can be selectively covered by means of cover plates 26, or fans 26, which can be operated in both directions of rotation, or connector plates 28 with hose sections 27. Equipping the openings 25 with these three built-in elements can be arbitrarily selected and optimally matched to the conditions of the interior of the switchgear cabinet and the distribution of the built-ins. For example, the heat absorbed by a cooling element 30 can be directly removed via a hose section 27, if the hose section is brought directly to this cooling element 30.

By means of the fans 26 it is possible to draw-off heated air or to blow in cold air at all those locations of the inner wall section 22 at which openings 25 are provided, if the fans 26 can be operated as suction and pressure blowers. Openings 25 which are not used are closed off by means of cover plates 28 in order to achieve defined flow conditions in the interior of the switchgear cabinet and over the heat exchanger.

If the input and the output connecting planes of the fan 26 are arranged at an acute angle with respect to each other, the fan 26 can be attached to the square opening 25 in any arbitrarily rotated position. Thus the draw-in and blow-in directions of the fan 26 can be oriented in different directions, as can be seen from the two fans 26 represented in the drawing.

The double-walled wall element 20 as the heat exchanger can also constitute the rear wall of the switchgear cabinet. However, it can also be embodied as the cabinet door.

What is claimed is:

1. A switchgear cabinet comprising:
   devices for cooling heated air generated therein, wherein at least one vertical side is closed off by a double-walled wall element (20) with outer wall sections and inner wall sections (21, 22) that form an air conduit

(23) with a large surface, a plurality of openings distributed over the inner wall section (22), and the openings each selectively covered by a cover plate (25), a plurality of fans (26) which can be operated in both directions of rotation, a hose section (27) with a connector plate (28), and the fans (26) having connecting planes at an acute angle with respect to each other.

2. The switchgear cabinet in accordance with claim 1, wherein the openings are distributed in a grid shape over the entire surface of the inner wall section (22).

3. The switchgear cabinet in accordance with claim 2, wherein
the inner wall section (22) is assembled from vertically divided wall panels.

4. The switchgear cabinet in accordance with claim 3, wherein the openings each have a square cross section.

5. A switchgear cabinet comprising: devices for cooling heated air generated therein, wherein at least one vertical side is closed off by a double-walled wall element (20) with outer wall sections and inner wall sections (21, 22) that form an air conduit (23) with a large surface, a plurality of openings distributed over the inner wall section (22), and the openings each selectively covered by a plurality cover plates (25), and fans (26) which can be operated in both directions of rotation, a hose section (27) with a connector plate (28), the openings distributed in a grid shape over the entire surface of the inner wall section (22), the inner wall section (22) assembled from vertically divided wall panels, the openings each having a square cross section, and the fans (26) having connecting planes at an acute angle with respect to each other.

6. The switchgear cabinet in accordance with claim 4, wherein each of the fans (26) is operated in one of a suction mode and a pressure blower mode.

7. The switchgear cabinet in accordance with claim 6, wherein
the hose sections (27) are resilient.

8. The switchgear cabinet in accordance with claim 7, wherein
the double-walled wall element (20) is designed as a heat exchanger.

9. The switchgear cabinet in accordance with claim 8, wherein
the double-walled wall element (20) is designed as one of a lateral wall and a rear wall of the switchgear cabinet.

10. The switchgear cabinet in accordance with claim 8, wherein
the double-walled wall element (20) is designed as a switchgear cabinet door.

11. The switchgear cabinet in accordance with claim 1, wherein the inner wall section (22) is assembled from vertically divided wall panels.

12. The switchgear cabinet in accordance with claim 1, wherein the openings each have a square cross section.

13. The switchgear cabinet in accordance with claim 1, wherein each of the fans (26) is operated in one of a suction mode and a pressure blower mode.

14. The switchgear cabinet in accordance with claim 1, wherein the hose sections (27) are resilient.

15. The switchgear cabinet in accordance with claim 1, wherein the double-walled wall element (20) is designed as a heat exchanger.

16. The switchgear cabinet in accordance with claim 1, wherein the double-walled wall element (20) is designed as one of a lateral wall and a rear wall of the switchgear cabinet.

17. The switchgear cabinet in accordance with claim 1, wherein the double-walled wall element (20) is designed as a switchgear cabinet door.

* * * * *